(12) United States Patent
Kuhne

(10) Patent No.: US 6,188,638 B1
(45) Date of Patent: Feb. 13, 2001

(54) INTEGRATED SEMICONDUCTOR MEMORY WITH CONTROL DEVICE FOR CLOCK-SYNCHRONOUS WRITING AND READING

(75) Inventor: Sebastian Kuhne, München (DE)

(73) Assignee: Siemens Aktiengesellschaft, Munich (DE)

( * ) Notice: Under 35 U.S.C. 154(b), the term of this patent shall be extended for 0 days.

(21) Appl. No.: 09/384,701

(22) Filed: Aug. 27, 1999

(30) Foreign Application Priority Data

Aug. 27, 1998 (DE) .............................. 198 39 105

(51) Int. Cl.[7] .................................................. G11C 8/18
(52) U.S. Cl. ........................... 365/233; 365/63; 365/51
(58) Field of Search .......................... 365/233, 63, 51, 365/189.12

(56) References Cited

U.S. PATENT DOCUMENTS 5,572,479 * 11/1996 Satou .............................. 365/230.06
5,629,903 * 5/1997 Agata .................................... 365/233

FOREIGN PATENT DOCUMENTS 54-123841 * 9/1979 (JP) ................................ G11C/7/00

OTHER PUBLICATIONS

"A 2.5–ns Clock Access, 250–MHz, 256 Mb SDRAM with Synchronous Mirror Delay", Takanori Saeki et al., IEEE Journal of Solid–State Circuit, vol. 31, No. 11, Nov. 1996, pp. 1656–1668.
JEDEC, Solid State Technology Division, Council Ballot, JCB–98–46, Apr. 20, 1998, Arlington, Virginia, pp. 1–16.

* cited by examiner

*Primary Examiner*—Andrew Q. Tran
(74) *Attorney, Agent, or Firm*—Herbert L. Lerner; Laurence A. Greenberg; Werner H. Stemer

(57) ABSTRACT

In an integrated semiconductor memory with clock-synchronous read and write accesses, the access control device is configured to be switchable between one-way and two-way data strobe mode. The access mode is set using a bond option or a mode register.

8 Claims, 3 Drawing Sheets

INTEGRATED SEMICONDUCTOR MEMORY WITH CONTROL DEVICE FOR CLOCK-SYNCHRONOUS WRITING AND READING

BACKGROUND OF THE INVENTION

FIELD OF THE INVENTION

The invention relates to an integrated semiconductor memory having a multiplicity of storage cells as well as a control device for clock-synchronous writing and reading of a data value.

Integrated semiconductor memories with clock-synchronous input and output are known as SDRAMs. Standardization is desirable for a time profile of the signals during the input and output, for example JEDEC, Solid State Technology Division, Council Ballot, JCB-98-46, 20 April 1998, Arlington, Va. According to the standardization proposal, data input and data output signals are coupled to a sampling signal (data strobe signal). The data strobe signal is produced internally to the chip. It is for its part coupled to an externally provided clock which also controls the other functional units of the semiconductor memory. The respective signal profiles for the data output and data input are presented in FIG. 5-1 and FIG. 9.1 of the JEDEC standardization proposal. The data strobe signal is also provided outside the integrated semiconductor memory. It is then available to the modules communicating with the semiconductor memory, in order to control the data interchange during a memory access. This requires a corresponding circuit outlay in the system environment of the semiconductor memory.

SUMMARY OF THE INVENTION

It is accordingly an object of the invention to provide an integrated semiconductor memory with a control device for clock-synchronous writing and reading that overcomes the above-mentioned disadvantages of the prior art devices of this general type, which is universally usable.

With the foregoing and other objects in view there is provided, in accordance with the invention, an integrated semiconductor memory, including:

a multiplicity of storage cells;

a control device for clock-synchronous writing and for reading a data value to and from one of the multiplicity of storage cells, the control device controlling the writing such that the data value represented in a data signal being received by the control device is coupled to a second clock signal and the second clock signal is coupled to a first clock signal received by the control device, the control device controlling the reading such that, in a first operating mode, the data value represented by the data signal is coupled only to the first clock signal, and in a second operating mode the data value represented by the data signal is coupled to the second clock signal and the second clock signal is coupled to the first clock signal; and a device for producing a control signal to be fed to the control device for switching over between the first operating mode and the second operating mode.

The semiconductor memory according to the invention is operated in the first or the second operating mode during a reading operation. In the first operating mode, the output data signal is coupled only to the system clock that is present in any case and controls the other functional units of the semiconductor memory. In the second operating mode, as in the JEDEC standardization proposal, a further clock signal is provided which is used as a data strobe signal and to which the data output signal is coupled. Since, according to the JEDEC standardization proposal, the coupling between the clock signal, data strobe signal and data signal is tight, that is to say the time tolerance of the relative time reference of the signals with respect to one another is small, the first operating mode without using the data strobe signal is compatible with the second operating mode with use of the data strobe signal. Therefore, the user of the integrated semiconductor memory has a multifunctional semiconductor memory which allows clock-synchronous reading of the semiconductor memory both with and without a data strobe signal.

Refinements of the invention relate to the ways of setting the first and second operating modes. The operating mode can be set using what is referred to as bond options. To do this, a control signal controlling the switching between the first and second operating modes is provided by a bonding pad. The way in which it is bonded defines the signal. A constant voltage, for example a supply voltage, is applied to the pad in order to set one operating mode. To do this, a bonding wire is bonded from the pad to a lead finger which is at a supply potential. The lead finger is conventionally also bonded to a further supply potential pad. For the other operating mode, the pad remains unconnected, the control signal being produced internally to the circuit by pull-up or pull-down elements.

As an alternative to the bond option, the control signal may be set by a mode register. A register of this type is in any case present on the integrated semiconductor chip for setting other operating parameters. The control signal is tapped at the output of a memory element of the mode register. The memory element is set to the desired status during a phase of initializing the semiconductor chip. This status is externally delivered to the mode register, for example by a microcontroller controlling the system.

Although the semiconductor memory can be operated in various operating modes during reading, only a single circuit configuration is necessary. By simple methods such as the bond option or setting the mode register, the operating mode is tailored to the system environment in question.

Other features which are considered as characteristic for the invention are set forth in the appended claims.

Although the invention is illustrated and described herein as embodied in an integrated semiconductor memory with a control device for clock-synchronous writing and reading, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
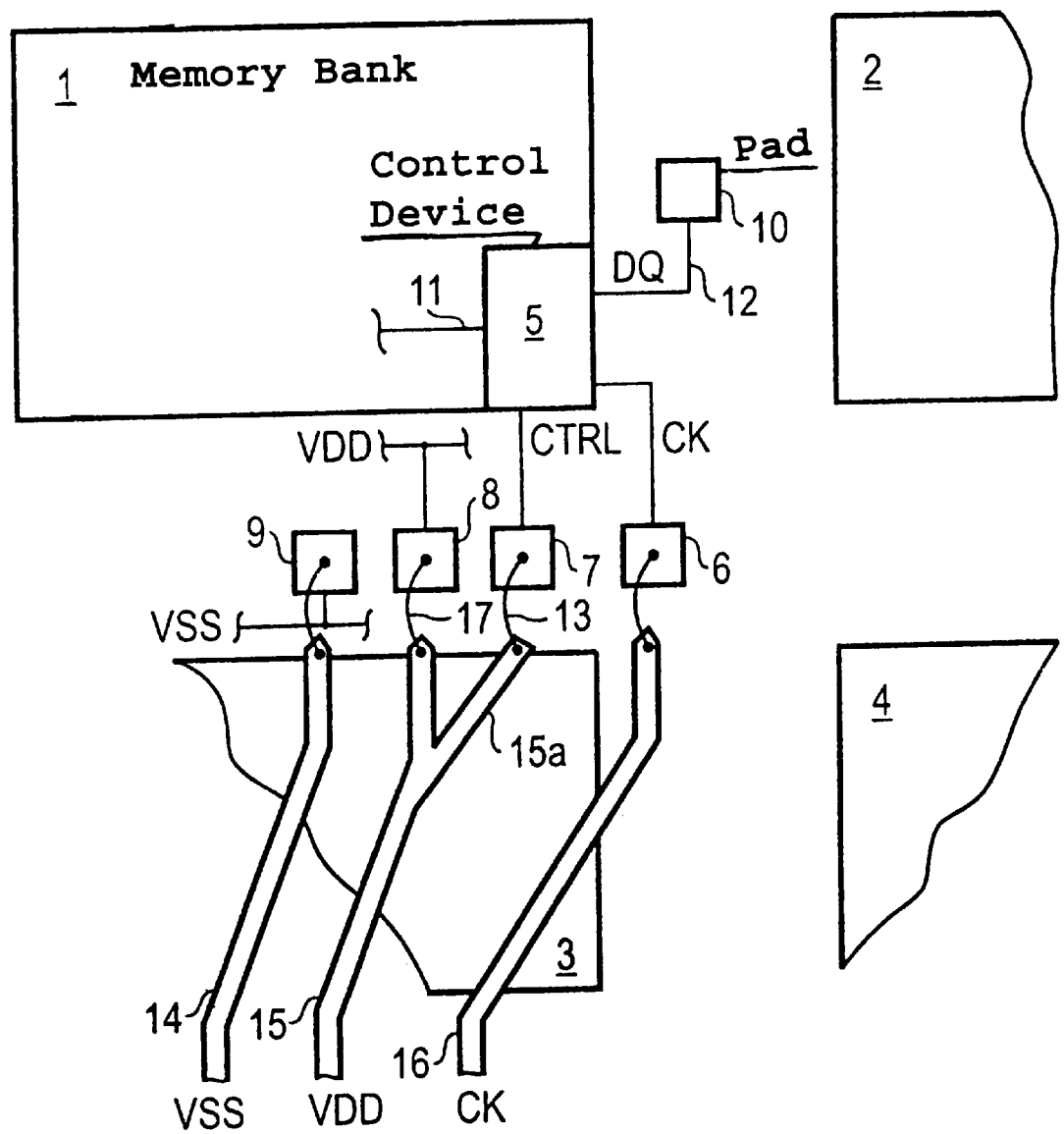
FIG. 1 is a diagrammatic, fragmentary, view of an integrated semiconductor memory with operating modes being set using a bond option according to the invention.

In all the figures of the drawing, sub-features and integral parts that correspond to one another bear the same reference symbol in each case. Referring now to the figures of the drawing in detail and first, particularly, to FIG. 1 thereof, there is shown a semiconductor memory containing four memory banks 1, 2, 3, 4. Each memory bank 1–4 contains a multiplicity of storage cells. Between the memory banks 1–4, usually at an edge of each memory bank 1–4, functional units are disposed which control the operation of the memory bank 1–4. They may be circuits for address decoding, for storage cell refresh of dynamic memories and similar circuits. In particular, a control device 5 for time control of memory accesses is provided at the edge of the memory bank 1. A line 11 leads into a memory cell array in order to write data values there into a storage cell or read data values from it. A line 12 is connected to a connection pad 10 at which data represented by a data signal DQ are taken from the memory or delivered to it. Via a connection pad 6, a clock signal CK, which controls the functional units within the memory, is fed to the memory. The time control of the control device 5 is likewise derived from the clock signal CK.

Figure 4:
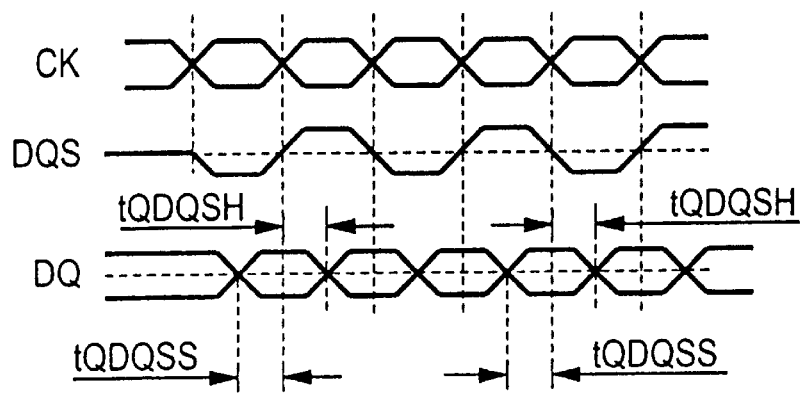
FIG. 4 is a signal diagram for a write access.

The signal profile during a write access to the memory is represented in FIG. 4. FIG. 4 shows the clock signal CK as well as its complement, a further clock signal DQS coupled to the clock signal CK and a data signal DQ with the data values to be entered. The further clock signal DQS is a so-called data strobe signal using which the data DQ are validated. The data strobe signal DQS is necessary for preventing runtime problems. For this purpose, the data signal DQ is always transmitted together with the data strobe signal DQS. The data signal DQ is available clock-synchronized with the data strobe signal DQS. The data strobe signal DQS is produced inside the control device 5 coupled to the system clock CK. The data values of the data signal DQ are coupled to the data strobe signal DQS to within a certain tolerance. Therefore, the data values of the data signal DQ are, in relation to the data strobe signal DQS validly applied at least at a predetermined setup time tQDQSS before a reference edge of the signal DQS and a holding time tQDQSH after the edge. Overall, the data signal DQ is therefore temporally coupled to the data strobe signal DQS, which is in turn coupled to the system clock CK.

Figure 5:
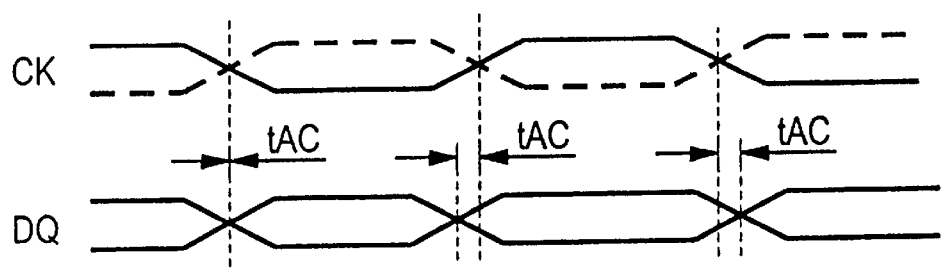
FIG. 5 is a signal diagram for a read and write access according to a first operating mode.

A data value is read from the semiconductor memory alternately according to a first or a second operating mode. The access control device 5 switches between the two operating modes according to a control signal CTRL delivered to it. The time profile of the relevant signals during the first operating mode is represented in FIG. 5. The data signal DQ is coupled directly within certain time tolerances to the system clock CK. A tolerance tAC for the access time is indicated in FIG. 5.

Figure 6:
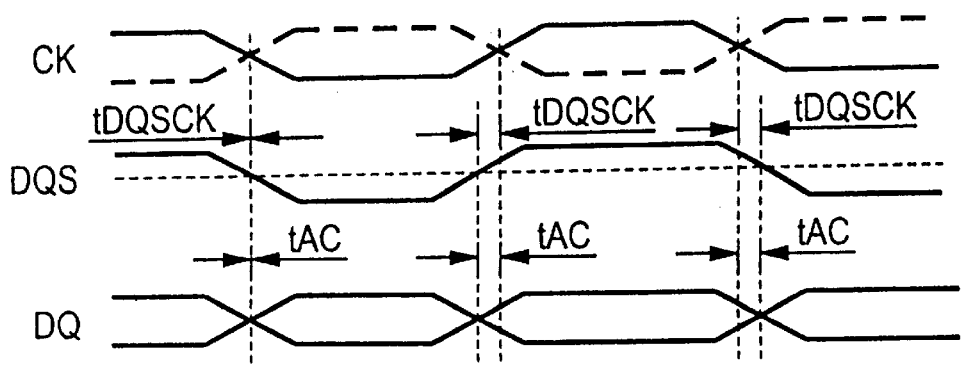
FIG. 6 is a signal diagram for a read and write access according to a second operating mode.

In the second operating mode, for which the time profile of the relevant signals in represented in FIG. 6, the data strobe signal DQS, to which the output signal DQ is coupled within the window for the access time tAC, is provided. For its part, the data strobe signal DQS is coupled to the system clock CK. There is a tolerance tDQSCK between the system clock CK and the data strobe signal DQS. In the second operating mode, the data signal DQ is therefore coupled to the data strobe signal DQS, which is in turn coupled to the system clock CK.

If the control device 5 is in the first operating mode setting, the data strobe signal DSQ is used when writing, but not when reading. This operating mode setting is therefore referred to as one-way data strobe mode. When the control device 5 is in the second operating mode setting, the data strobe signal is used both for writing and for reading. This operating mode setting is therefore referred to as two-way data strobe mode. The control device 5 can be switched over between one-way and two-way data strobe mode using the control signal CTRL.

Figure 2:
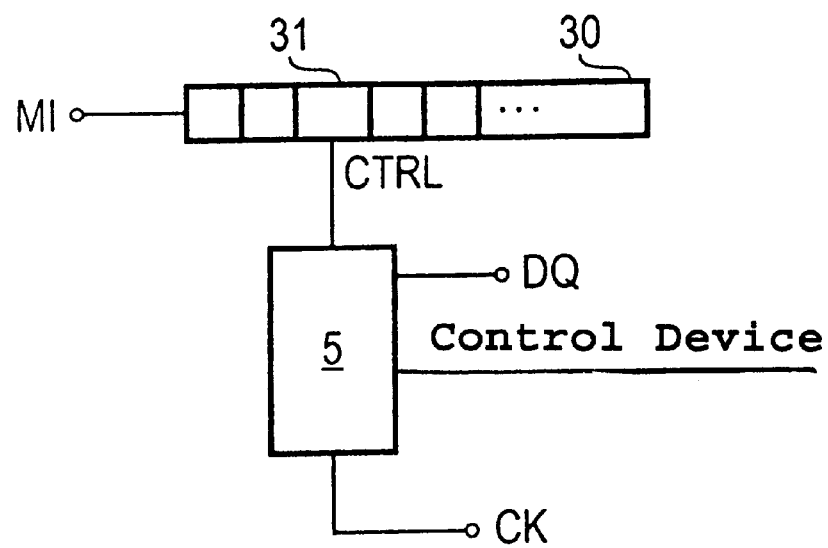
FIG. 2 is a block diagram of an excerpt for the case in which the operating modes are set using a mode register.

In order to switch over between the two modes, or operating mode settings, the alternative embodiment options shown in FIGS. 1 and 2 are available. The representation in FIG. 1 uses the so-called bond option. For this purpose, a connection pad 7 is provided, which is connected to the control device 5. The control signal CTRL is provided at the pad 7. In order to set one of the operating modes, for example the two-way data strobe mode, one of the supply potentials, in this case the supply potential VDD, is applied to the pad 7. To do this, the pad 7 is connected via a bonding wire 13 to a finger 15 of a lead frame 14–16 that is at the potential VDD. The finger 15 of the lead frame 14–16 is further connected via a bonding wire 17 to a pad 8, which delivers the supply potential VDD to the other functional units of the semiconductor memory. The finger 15 expediently has a branch 15a on the chip side, to which the bonding wire 13 is connected. In the known way, the lead frame contains a multiplicity of fingers, of which the fingers 14, 15 and 16 are represented. These are respectively bonded at one end to a pad on the integrated circuit. The other end is fed out of the package and is used, for example, as a connection pin to which a supply potential or a signal is to be applied. In the embodiment represented, the control signal CTRL is at the potential VDD that is interpreted in the control device 5 as an instruction to set the two-way data strobe mode. In order, instead of this, to set the one-way data strobe mode, the pad 7 is unconnected. The control signal CTRL is then at the potential VSS for the one-way data strobe mode, this being obtained by a pull-down resistor 21 in the device 5 (see FIG. 3).

Figure 3:
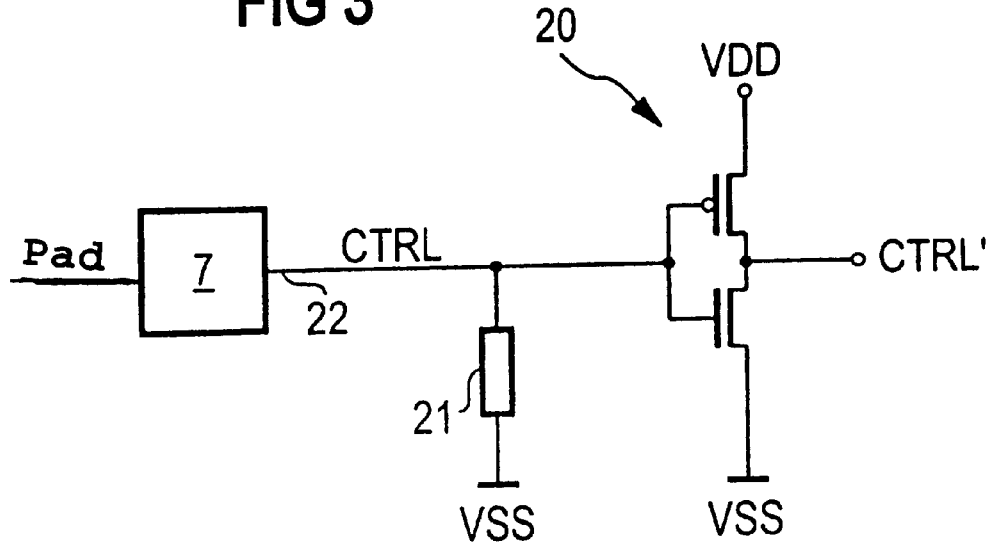
FIG. 3 is a circuit diagram of a circuit input of a control device for the bond option.

FIG. 3 represents an input stage of the control device 5. It contains an inverter 20 that is connected on an input side to the pad 7. On an output side, the inverter 20 carries a signal CTRL' which is further processed in the device 5. While one of the operating mode settings, for example two-way data strobe mode, is established using a bonding connection of the pad 7 to the lead finger 15 for the supply potential VDD, for setting the other operating mode, for example one-way data. strobe mode, the pad 7 remains unconnected. The pull-down resistor 21 draws the potential of a line 22 to ground potential VSS. If, as an alternative, the pad 7 for connection to a lead finger for the supply potential VSS is provided, then a pull-up resistor is connected between the input of the inverter 20 and the positive supply potential VDD. The two-way data strobe mode is in this case obtained by the control signal CTRL with the level of the supply potential VSS, when the pad 7 is connected to the lead finger which is at this potential VSS, and the one-way data strobe mode is obtained by the control signal with the level of the supply potential VDD when the pad 7 is unconnected.

As an alternative to the bond option, it is expedient to set the operating mode of the control device 5 using a mode register 30. The mode register 30 has a multiplicity of storage cells 31 whose stored statuses define operating parameters of the semiconductor memory. A storage cell 31 contains one of the two statuses of the control signal CTRL and is connected on an output side to the control device 5.

The mode register 30 is conventionally preloaded with data MI during an initialization procedure. Preferably, the initialization procedure takes place following the application of the supply voltage during the so-called power-up phase. At the start of normal operations, the desired operating mode setting is therefore already provided. The initialization data MI for the mode register 30 are externally delivered to the semiconductor memory and, for example, produced by a microcontroller that controls the application system which contains the semiconductor memory.

Irrespective of the desired operating mode (one-way or two-way data strobe mode) the same circuit configurations are used. The operating mode is not set until bonding after the silicon production in the back end processing or, as an alternative, the desired operating mode is set in the target system itself during the initialization phase.

I claim:

1. An integrated semiconductor memory, comprising:
   a multiplicity of storage cells;
   a control device for clock-synchronous writing and for reading a data value to and from one of said multiplicity of storage cells, said control device controlling the writing such that the data value represented in a data signal received by the control device is coupled to a second clock signal and the second clock signal is coupled to a first clock signal received by said control device, said control device controlling the reading such that, in a first operating mode, the data value represented by the data signal being coupled only to the first clock signal, and in a second operating mode the data value represented by the data signal being coupled to the second clock signal and the second clock signal is coupled to the first clock signal; and
   a device for producing a control signal to be fed to said control device for switching over between the first operating mode and the second operating mode.

2. The integrated semiconductor memory according to claim 1, wherein said device includes at least two connection pads having a first pad coupled to said control device for providing the control signal and a second pad for receiving a constant potential, said first pad connected to said second pad in one of the first operating mode and the second operating mode, and no connection is made between said first pad and said second pad in the other of the first operating mode and the second operating mode.

3. The integrated semiconductor memory according to claim 2, including a bonding wire for forming a connection between said first pad and said second pad.

4. The integrated semiconductor memory according to claim 3, including a lead frame having fingers and said bonding wire is fed from said first pad to one of said fingers of said lead frame, said one of said fingers connected to said second pad.

5. The integrated semiconductor memory according to claim 2, wherein said second pad is to be connected to a first pole of a supply voltage.

6. The integrated semiconductor memory according to claim 5, including a resistor and a conductor carrying the control signal, said conductor is coupled via said resistor to a second pole of the supply voltage.

7. The integrated semiconductor memory according to claim 1, including a storage element having an output connected to said control device for delivering the control signal to said control device.

8. The integrated semiconductor memory according to claim 7, wherein during a initializing phase, a status of said storage element can be set as a function of a further data value that can be input externally.

* * * * *